（12）United States Patent
Tsai et al.

(10) Patent No.: US 10,630,105 B2
(45) Date of Patent: Apr. 21, 2020

(54) AC-OK DETECTION CIRCUIT AND METHOD

(71) Applicant: SCHNEIDER ELECTRIC IT CORPORATION, West Kingston, RI (US)

(72) Inventors: Ping-Chuan Tsai, New Taipei (TW); Luka Petrovic, Billerica, MA (US); Wen-Chun Peng, New Taipei (TW)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 53 days.

(21) Appl. No.: 15/684,302

(22) Filed: Aug. 23, 2017

(65) Prior Publication Data

US 2019/0067987 A1 Feb. 28, 2019

(51) Int. Cl.
*H02J 9/06* (2006.01)
*G01R 19/165* (2006.01)
*H02J 7/00* (2006.01)
*G01R 19/155* (2006.01)

(52) U.S. Cl.
CPC .......... *H02J 9/061* (2013.01); *G01R 19/155* (2013.01); *G01R 19/165* (2013.01); *H02J 7/0052* (2013.01); *H02J 9/062* (2013.01)

(58) Field of Classification Search
CPC ........ H02J 9/06; H02J 9/02; H02J 9/04; H02J 7/00; H02J 7/007; H02J 7/0027; H02J 7/0052; H02J 1/00; H02J 1/02; H02J 1/06
USPC .......................................................... 307/64
See application file for complete search history.

(56) References Cited

U.S. PATENT DOCUMENTS

| 9,871,409 | B2* | 1/2018 | Ghosh | ........................ H02J 9/06 |
| 2005/0151524 | A1* | 7/2005 | Sae-Ueng | ............... H02M 3/28 323/282 |
| 2007/0138996 | A1* | 6/2007 | Kobayashi | ........ H01M 8/04559 320/101 |
| 2010/0225280 | A1* | 9/2010 | Vogel | ..................... H02J 7/045 320/145 |

(Continued)

FOREIGN PATENT DOCUMENTS

WO 20140193362 A1 12/2014

OTHER PUBLICATIONS

Extended European Search Report from corresponding European Application No. 18181372.6 dated Oct. 23, 2018.

*Primary Examiner* — Carlos Amaya
*Assistant Examiner* — Jagdeep S Dhillon
(74) *Attorney, Agent, or Firm* — Lando & Anastasi, LLP

(57) ABSTRACT

According to one aspect, embodiments of the invention provide a power circuit comprising an input to receive input AC power from an AC source, an auxiliary charger configured to convert the input AC power from the input into DC power, a differential amplifier configured to be powered by the DC power from the auxiliary charger, to monitor the input AC voltage level of the input AC power, and to generate a sense signal based on a status of the input AC voltage level, and a processor coupled to the auxiliary charger and the differential amplifier, the processor configured to be coupled to an LPS, to be powered into a low power mode by the DC power from the auxiliary charger, and to analyze the sense signal from the differential amplifier in the low power mode of operation. According to one embodiment, the auxiliary charger is an offline DC-DC converter.

19 Claims, 5 Drawing Sheets

(56) References Cited

U.S. PATENT DOCUMENTS

| | | | | |
|---|---|---|---|---|
| 2011/0043042 A1* | 2/2011 | Klikic | .................... | H02J 9/062 |
| | | | | 307/66 |
| 2013/0307339 A1* | 11/2013 | Subramanium | ..... | H02M 1/4225 |
| | | | | 307/66 |
| 2016/0134160 A1* | 5/2016 | Schultz | ............... | H01M 10/441 |
| | | | | 307/66 |
| 2016/0352127 A1 | 12/2016 | Prakash | | |
| 2017/0099011 A1* | 4/2017 | Freeman | ................ | H02M 7/06 |
| 2017/0133842 A1* | 5/2017 | Freeman | ................ | H02J 1/00 |
| 2018/0278053 A1* | 9/2018 | Uan-Zo-li | ............... | H02J 7/007 |

* cited by examiner

AC-OK DETECTION CIRCUIT AND METHOD

BACKGROUND

1. Field of Invention

The present invention relates generally to systems and methods for controlling an Uninterruptible Power Supply (UPS).

2. Discussion of Related Art

The use of power devices, such as uninterruptible power supplies (UPS), to provide regulated, uninterrupted power for sensitive and/or critical loads, such as computer systems and other data processing systems, is known. Known uninterruptible power supplies include on-line UPS's, off-line UPS's, line interactive UPS's as well as others. On-line UPS's provide conditioned AC power as well as back-up AC power upon interruption of a primary source of AC power. Off-line UPS's typically do not provide conditioning of input AC power, but do provide back-up AC power upon interruption of the primary AC power source. Line interactive UPS's are similar to off-line UPS's in that they switch to battery power when a blackout occurs but also typically include a multi-tap transformer for regulating the output voltage provided by the UPS. Logic Power Supply (LPS) systems typically provide required bias power to different subsystems (e.g., a Digital Signal Processor (DSP), microcontroller, control and communication systems, gate driver, etc.) of an Uninterruptible Power Supply (UPS).

SUMMARY

At least one aspect of the invention is directed to a power circuit comprising an input configured to be coupled to an AC source and to receive input AC power from the AC source, the input AC power having an input AC voltage level, an auxiliary charger coupled to the input, the auxiliary charger configured to convert the input AC power from the input into DC power, a differential amplifier coupled to the auxiliary charger and the input, the differential amplifier configured to be powered by the DC power from the auxiliary charger, to monitor the input AC voltage level, and to generate a sense signal based on a status of the input AC voltage level, and a processor coupled to the auxiliary charger and the differential amplifier, the processor configured to be coupled to a Logic Power Supply (LPS), to be powered into a low power mode of operation by the DC power from the auxiliary charger, and to analyze the sense signal from the differential amplifier in the low power mode of operation. According to one embodiment, the auxiliary charger is an offline DC-DC converter.

According to one embodiment, the differential amplifier comprises an operational amplifier coupled to the input and a supply voltage, the differential amplifier configured to generate the sense signal based on a difference between the input AC voltage level and the supply voltage. In one embodiment, the operational amplifier includes a supply input coupled to the auxiliary charger and configured to receive the DC power. In another embodiment, in analyzing the sense signal, the processor is further configured to determine whether the sense signal indicates that the input AC voltage level is within an input voltage threshold range. In one embodiment, in response to determining that the sense signal indicates that the input AC voltage level is within the input voltage threshold range, the processor is further configured to transmit a signal to the LPS to turn on the LPS. In another embodiment, in response to the LPS turning on, the processor is further configured to enter a normal mode of operation, and to communicate, in the normal mode of operation, with an Uninterruptible Power Supply (UPS) coupled to the LPS to initialize at least one system of the UPS.

According to another embodiment, the processor is further configured to maintain a buffer, and wherein in determining whether the sense signal indicates that the input AC voltage level is within the input voltage threshold range, the processor is further configured to periodically sample the sense signal, calculate, based on the periodically sampled sense signal, a plurality of values, each value corresponding to the input AC voltage level over a period of time, and store each one of the plurality of values in a position of the buffer. In one embodiment, in determining whether the sense signal indicates that the input AC voltage level is within the input voltage threshold range, the processor is further configured to determine whether each position in the buffer is full, in response to determining that each position in the buffer is full, sum each one of the plurality of values stored in the buffer to generate a total summed value, compare the total summed value to a summed threshold limit window, and determine, based on comparing the total summed value to the summed threshold limit window, whether the input AC voltage level is within the input voltage threshold range. In another embodiment, in determining whether the input AC voltage level is within the input voltage threshold range, the processor is further configured to determine that the input AC voltage level is within the input voltage threshold range in response to determining that the total summed value is within the summed threshold limit window.

Another aspect of the invention is directed to a method for operating an LPS of an Uninterruptible Power Supply, the method comprising acts of receiving input AC power from an AC source, the input AC power having an input AC voltage level, converting the input AC power into DC power, powering a differential amplifier with the DC power, powering a processor into a low power mode of operation with the DC power, monitoring, with the differential amplifier, the input AC power, generating, based on the act of monitoring, a sense signal, analyzing, with the processor in the low power mode of operation, the sense signal, and controlling an operational state of the LPS based on the act of analyzing the sense signal.

According to one embodiment, generating the sense signal comprises generating the sense signal based on a difference between the input AC voltage level and a supply voltage. In one embodiment, the differential amplifier includes an operational amplifier and powering the differential amplifier with the DC power comprises providing the DC power to a supply input of the operational amplifier. In another embodiment, analyzing the sense signal comprises determining whether the sense signal indicates that the input AC voltage level is within an input voltage threshold range.

According to another embodiment, controlling the operational state of the LPS comprises transmitting a signal to the LPS to turn on the LPS in response to determining that the sense signal indicates that the input AC voltage level is within the input voltage threshold range. In one embodiment, the method further comprises turning on the LPS, in response to turning on the LPS, powering up the processor into a normal mode of operation, and initializing, with the processor in the normal mode of operation, at least one system of the UPS. In another embodiment, determining whether the sense signal indicates that the input AC voltage level is within the input voltage threshold range comprises periodically sampling the sense signal, calculating, based on the periodically sampled sense signal, a plurality of values, each value corresponding to the input AC voltage level over a period of time, and storing each one of the plurality of values in a position of a buffer maintained by the processor.

According to one embodiment, determining whether the sense signal indicates that the input AC voltage level is within the input voltage threshold range further comprises determining whether each position in the buffer is full, in response to determining that each position in the buffer is full, summing each one of the plurality of values stored in the buffer to generate a total summed value, comparing the total summed value to a summed threshold limit window, and determining, based on comparing the total summed value to the summed threshold limit window, whether the input AC voltage level is within the input voltage threshold range. In one embodiment, determining whether the input AC voltage level is within the input voltage threshold range comprises determining that the input AC voltage level is within the input voltage threshold range in response to determining that the total summed value is within the summed threshold limit window.

At least one aspect of the invention is directed to a power circuit configured to be coupled to an LPS of a UPS, the power circuit comprising an input configured to be coupled to an AC source and to receive input AC power from the AC source, the input AC power having an input AC voltage level, an auxiliary charger coupled to the input, the auxiliary charger configured to convert the input AC power from the input into DC power, and means for generating a sense signal corresponding to the input AC voltage level, for analyzing the sense signal in a low power mode of operation, and for turning on the LPS in response to determining, based on the sense signal, that the input AC voltage level is at a level sufficient to power the UPS.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
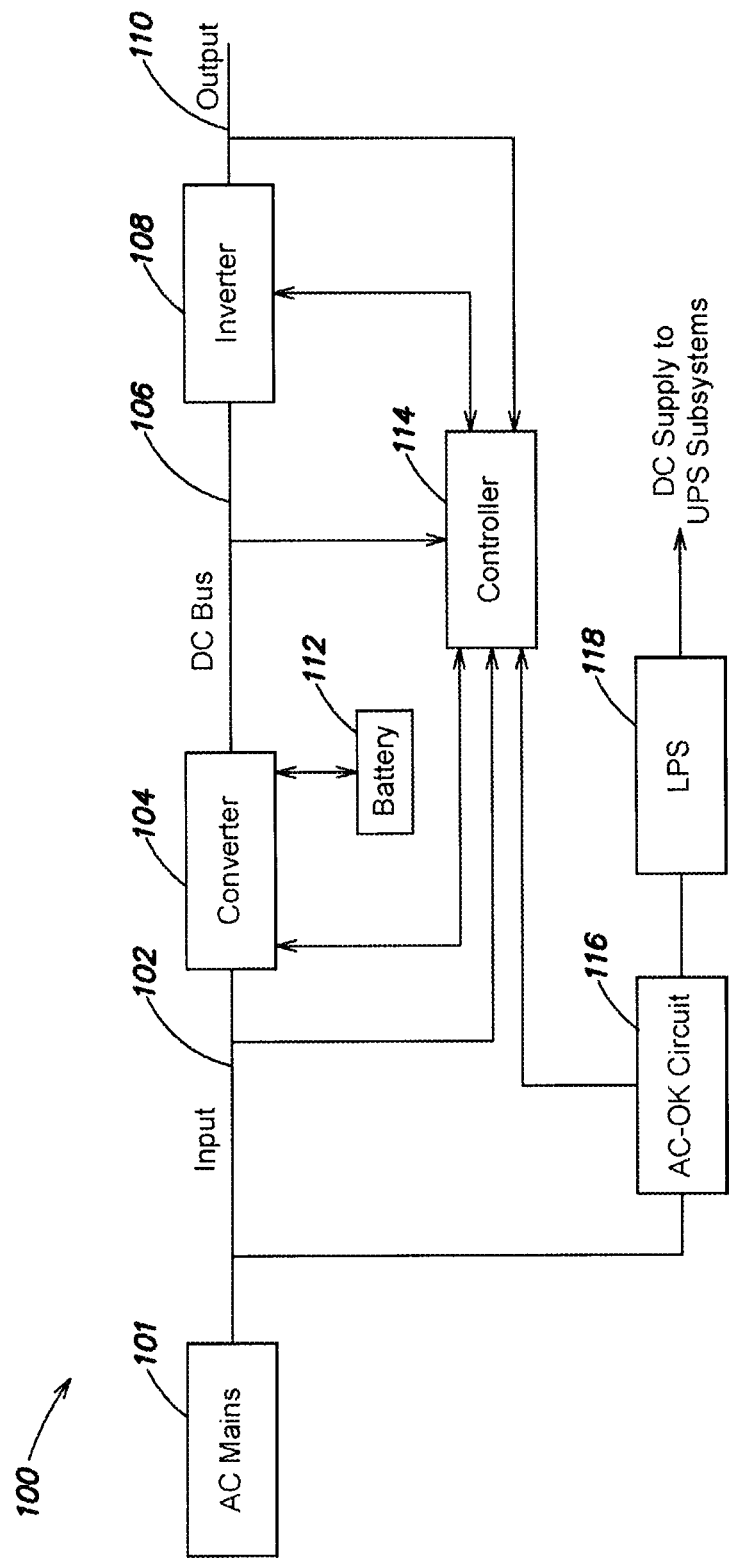
FIG. 1 is a block diagram of an online UPS according to aspects described herein.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, LPS systems typically provide required bias power to different subsystems (e.g., a DSP processor, microcontroller, control and communication systems, gate driver, etc.) of an Uninterruptible Power Supply (UPS). Typical UPS systems include a power circuit (i.e., an AC-OK circuit) that is configured to monitor the input AC voltage provided to the UPS system by a power source and wake-up the LPS system of the UPS upon determining that the input AC voltage is acceptable (e.g., above a threshold level). Traditional AC-OK circuits generally include a large number of components and are relatively complex. For example, some traditional AC-OK circuits include a full-wave rectifier coupled to the power source, a voltage divider coupled to the full-wave rectifier, and a comparator coupled to the voltage divider. The full-wave rectifier and the voltage divider operate to convert the input AC voltage from the power source to one or more DC reference voltage signals. The comparator receives the one or more DC reference voltage signals and based on the one or more reference voltages, determines whether the input AC voltage is acceptable. If the input AC voltage is acceptable, the comparator outputs a signal to the LPS system to turn on the LPS system. After being turned on, the LPS system provides DC supply power to different subsystems of the UPS system.

In addition to being complex and having a large number of components, the relatively large power dissipation/consumption of the full-wave rectifier and the voltage divider of a traditional AC-OK circuit can be an issue as the input power source is always under load by the rectifier and voltage divider. In addition, the DC voltage reference signals generated by the rectifier and the voltage divider of a traditional AC-OK circuit can include ripple which can affect accuracy of the AC-OK circuit. A new AC-OK is provided that is less complex, includes fewer components, and results in less power consumption/dissipation than traditional AC-OK circuits.

FIG. 1 is a block diagram of an online UPS 100 according to one aspect described herein. The UPS 100 includes an input 102, a converter 104, a DC bus 106, an inverter 108, an output 110, a battery 112, and a controller 114. The input 102 is coupled to the converter 104. The DC bus 106 is coupled between the converter 104 and the inverter 108. The output 110 is coupled to the inverter 108. The controller 114 is coupled to the input 102, the output 110, the converter 104, the DC bus 106, and the inverter 108. The battery is coupled to the converter 104.

The input 102 is configured to be coupled to an AC mains power source 101 and to receive input AC power having an input voltage level. When the UPS is fully operational, the controller 114 monitors the input AC power received by the input 102 and is configured to operate the UPS 100 in different modes of operation based on the status of the input AC power received by the input 102. When AC power provided to the input 102 is acceptable (i.e., above an input power threshold), the controller 114 operates the UPS 100 in an online mode of operation. In the online mode of operation, AC power from the input 102 is provided to the converter 104. According to one embodiment, the converter 104 is a Power Factor Correction converter 104; however, in other embodiments, other types of converters may be utilized.

The controller 114 operates the converter 104 to convert the AC power into DC power and provide the DC power to the DC bus 106. In one embodiment, DC power is also provided from the converter 104 to the battery 112 to charge the battery 112. In another embodiment, DC power from the DC bus 106 is provided to the battery 112 via a DC/DC converter (e.g., a charger) to charge the battery 112. In the online mode of operation, the inverter 108 receives DC power from the DC bus 106, and the controller 114 operates the inverter 108 to convert the DC power into regulated AC power and provide regulated AC power to a load coupled to the output 110.

When AC power provided to the input 102 is not acceptable (i.e., below an input power threshold), the controller 114 operates the UPS 100 in a backup mode of operation. In the backup mode of operation, DC power from the battery 112 is regulated (e.g., by the converter 104 or a DC/DC converter coupled to the battery 112) and provided to the DC bus 106. The inverter 108 receives the DC power from the DC bus 106, and the controller 114 operates the inverter 108 to convert the DC power into regulated AC power and provide the regulated AC power to the output 110.

The UPS 100 also includes an AC-OK circuit 116 and a Logic Power Supply (LPS) 118. The AC-OK circuit 116 is configured to be coupled to the AC mains power source 101. The LPS 118 is coupled to the AC-OK circuit 116 and to other subsystems within the UPS 100 (e.g., the controller 114, a DSP processor, microcontroller, control and communication systems, gate driver, or any other subsystem requiring DC supply voltage).

When the input AC power is first applied to the UPS 100, the AC-OK circuit 116 monitors the input AC power and determines whether the input AC power is acceptable (i.e., at a level sufficient to power the necessary components of the UPS 100). In response to a determination that the input AC power received by the UPS 100 is acceptable, the AC-OK circuit 116 sends a signal to the LPS 118 to turn on the LPS 118. Upon being turned on, the LPS 118 provides DC supply power to different subsystems within the UPS 100 (e.g., the controller 114, a DSP processor, microcontroller, control and communication systems, gate driver, or any other subsystem requiring DC supply voltage). Operation of the AC-OK circuit 116 is discussed in greater detail below with respect to FIGS. 2-3.

Figure 2:
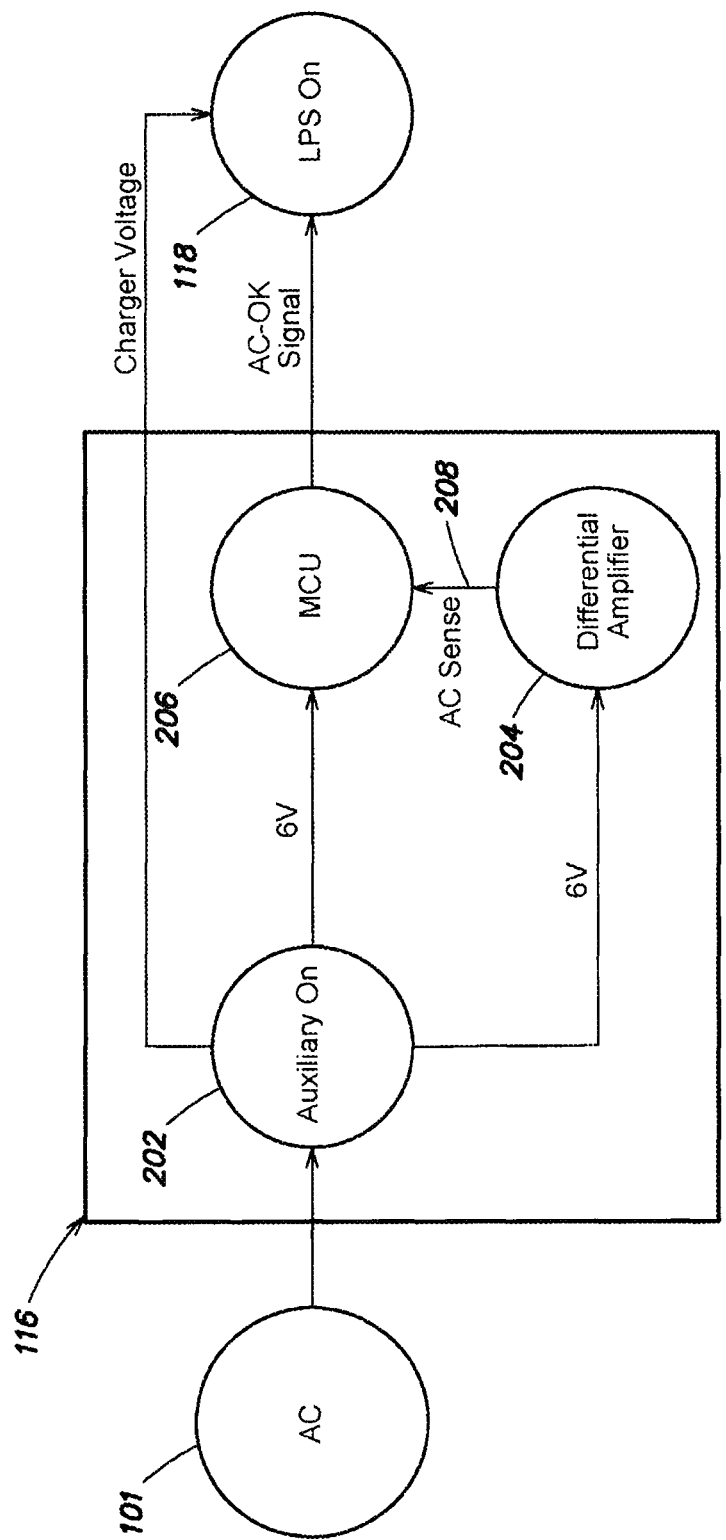
FIG. 2 is a block diagram of an AC-OK circuit according to aspects described herein.

FIG. 2 is a block diagram of the AC-OK circuit 116 according to at least one embodiment described herein. The AC-OK circuit 116 includes an auxiliary charger 202, a differential amplifier 204, and a processor 206. The auxiliary charger 202 is configured to be coupled to the AC mains power source 101. The differential amplifier 204 is coupled to the auxiliary charger 202 and the processor 206. The processor 206 is coupled to the auxiliary charger 202 and the LPS 118.

Figure 3:
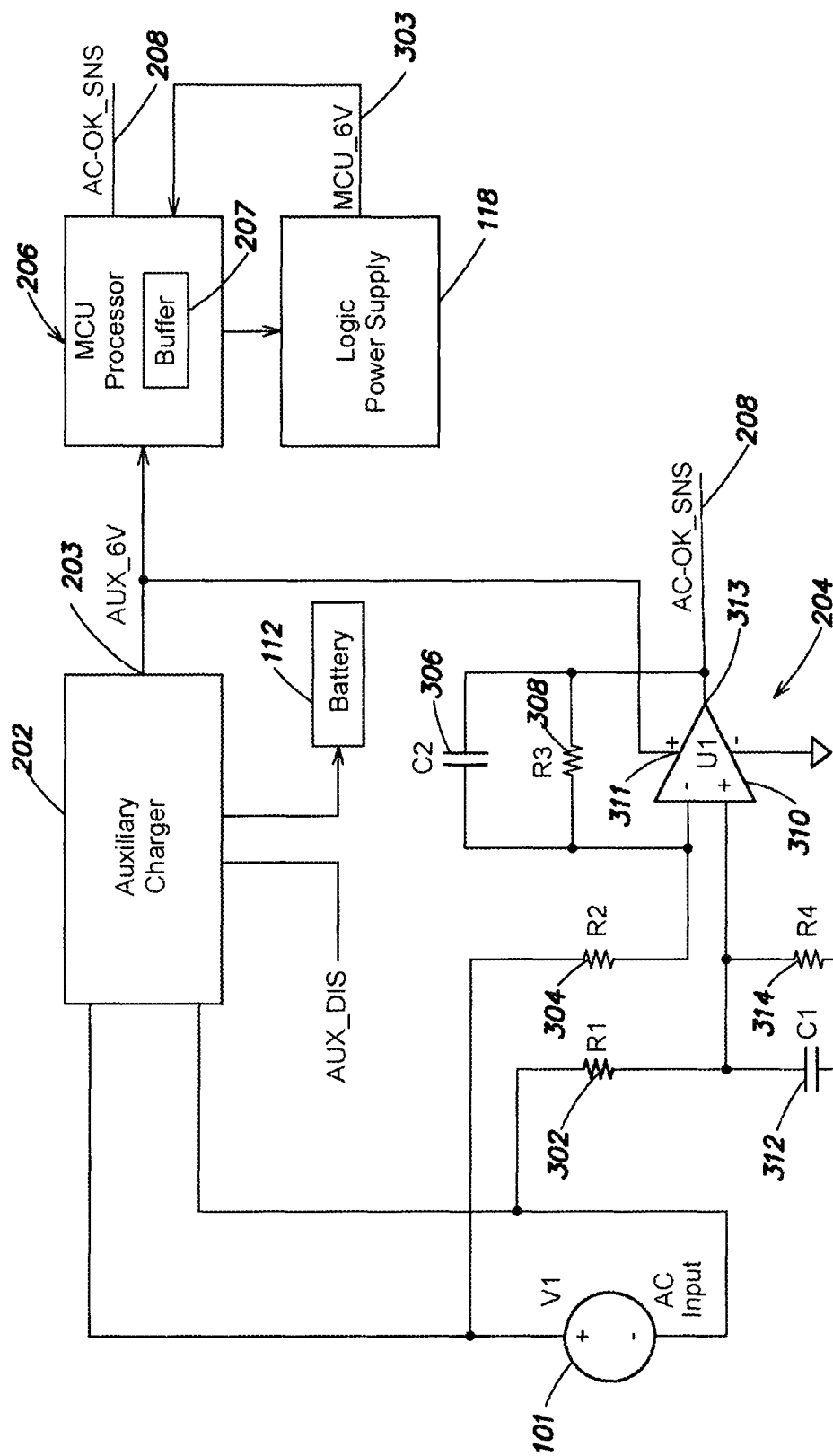
FIG. 3 is a more detailed block diagram of an AC-OK circuit according to aspects described herein.

FIG. 3 is a more detailed block diagram of the AC-OK circuit 116. As shown in FIG. 3, an input of the auxiliary charger 202 is configured to be coupled to the AC mains power source 101. An output 203 of the auxiliary charger 202 is coupled to the processor 206 and to the differential amplifier 204. The processor 206 is also coupled to the LPS 118 and the differential amplifier 204.

According to one embodiment shown in FIG. 3, the differential amplifier includes a first resistor (R1) 302, a second resistor (R2) 304, a third resistor (R3) 308, a fourth resistor (R4) 314, a first capacitor (C1) 312, a second capacitor (C2) 306, and an operational amplifier 310. The first resistor (R1) 302 is configured to be coupled between the AC mains power source 101 and the non-inverting input of the operational amplifier 310. The first capacitor (C1) 312 is coupled between the non-inverting input of the operational amplifier 310 and a supply voltage 309 (e.g., 3V). The fourth resistor (R4) 314 is also coupled between the non-inverting input of the operational amplifier 310 and the supply voltage (e.g., 3V). The second resistor (R2) 304 is configured to be coupled between the AC mains power source 101 and the inverting input of the operational amplifier 310. The third resistor (R3) 308 is coupled between the inverting input and the output of the operational amplifier 310. The second capacitor (C2) 306 is also coupled between the inverting input and the output of the operational amplifier 310. The negative supply input of the operational amplifier 310 is coupled to ground and the positive supply input 311 of the operational amplifier 310 is coupled to the output 203 of the auxiliary charger 202. The output 313 of the operational amplifier is coupled to the processor 206. In other embodiments, the differential amplifier 204 may be configured differently.

In reference to FIGS. 2 and 3, when input AC power from the AC mains power source 101 is applied to the UPS 100, the input AC power is also provided to the AC-OK circuit 116. The auxiliary charger 202 of the AC-OK circuit 116 converts the input AC power into DC power having a relatively low DC voltage level (e.g., 6V). According to one embodiment, the auxiliary charger 202 is an offline DC-DC converter (e.g., a fly-back converter); however, in other embodiments, the auxiliary charger 202 is another type of DC-DC converter or charger. The DC power from the auxiliary charger 202 is provided, as the supply voltage, to the positive supply input 311 of the operational amplifier 310 of the differential amplifier 204. Upon being powered by the DC power from the auxiliary charger 202, the differential amplifier 204 analyzes the input AC power received by the UPS 100 and outputs an AC-OK sense signal 208 (AC-OK_SNS) derived from the status of the input AC power. The AC-OK sense signal 208 generated by the differential amplifier 204 represents the difference between input AC voltage provided to the AC-OK circuit 116 and a reference voltage provided to the differential amplifier 204.

The DC power from the auxiliary charger 202 is also provided to the processor 206. Upon receiving the DC power from the auxiliary charger 202, the processor 206 enters a low power mode. In the low power mode, the processor 206 monitors the AC_OK sense signal 208 output by the differential amplifier 204. In response to determining that the AC_OK sense signal 208 indicates an unacceptable input AC power level (e.g., below a threshold level), the processor 206 continues to monitor the AC_OK sense signal 208. In response to determining that the AC_OK sense signal 208 indicates an acceptable input AC power level (e.g., above a threshold level), the processor 206 turns on the LPS 118. Upon being turned on, the LPS 118 generates one or more supply voltages 303 (e.g., 6V, 3.3V, etc.) that are configured to be provided to different components of the UPS 100. According to one embodiment, the LPS 118 provides a 6V supply voltage (MCU_6V) to the processor 206; however, in other embodiments, the LPS 118 may provide a supply voltage to the processor 206 at a different level. Once the processor 206 receives the supply voltage 303 from the LPS 118, the processor 206 communicates with the controller 114 of the UPS 100 to bring the UPS 100 into full operation. Operation of the processor 206 of the AC-OK circuit 116 is discussed in greater detail below with respect to FIG. 4.

Figure 4:
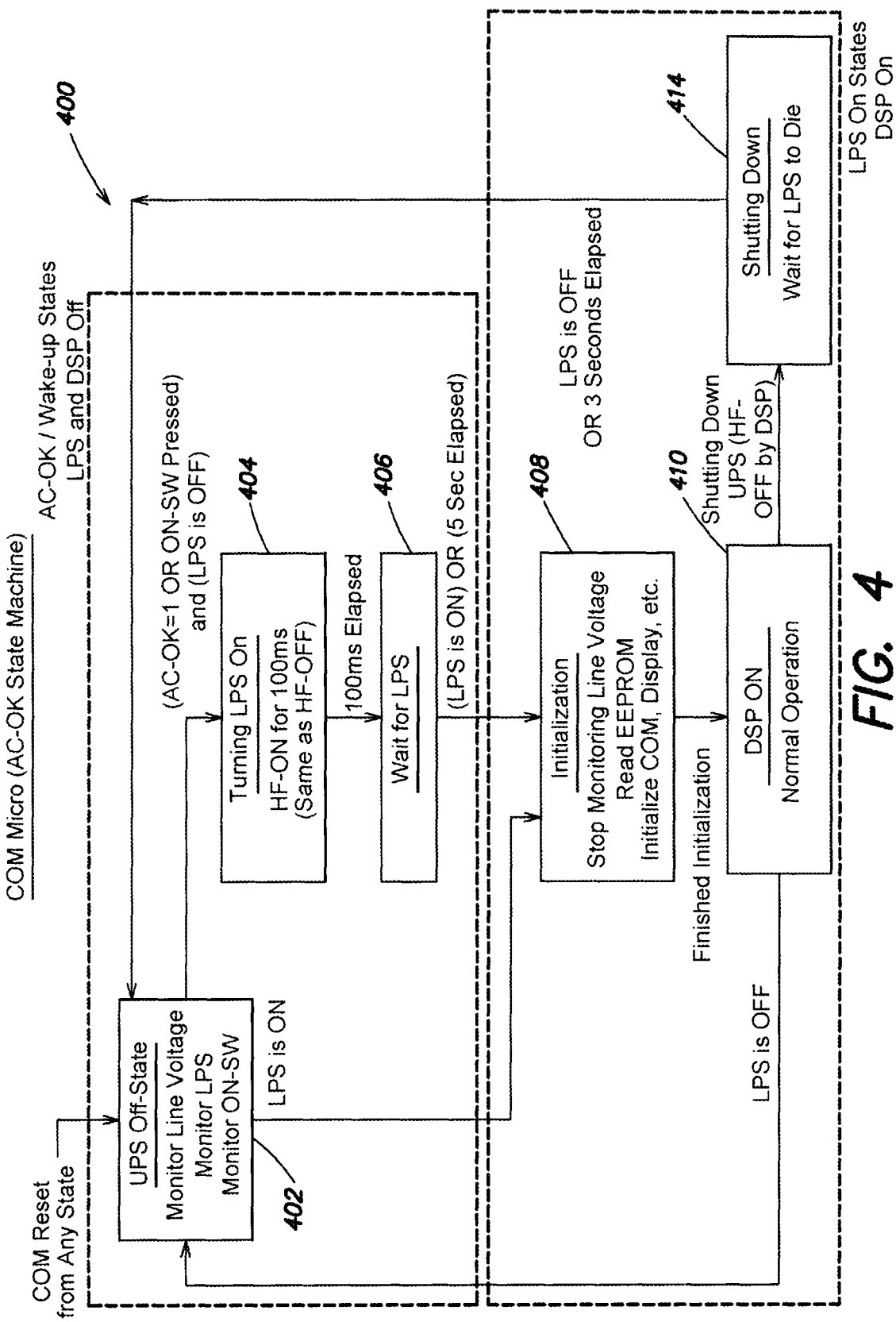
FIG. 4 is a flow chart illustrating operation of a processor in an AC-OK circuit according to aspects described herein.

FIG. 4 is a flow chart 400 illustrating operation of the processor 206 according to at least one embodiment. At block 402, the UPS 100 is off and the processor 206 is powered into a low power state by DC voltage received from the auxiliary charger 202. In the low power state, the processor 206 operates with limited functions and simply monitors the AC-OK sense signal 208 output by the differential amplifier 204. In response to determining that the AC_OK sense signal 208 indicates an unacceptable input AC power level, the processor 206 continues to monitor the AC_OK sense signal 208 at block 402. At block 404, in response to determining that the AC_OK sense signal 208 indicates an acceptable input AC power level, the processor 206 turns on the LPS 118.

According to at least one embodiment, in the low power state at block 402, the processor 206 also monitors a supply voltage (e.g., 3.3V supply) of the LPS 118 to determine whether the LPS 118 is on or off. In such an embodiment, the processor 206 will only turn on the LPS 118 (i.e., at block 404) in response to determining that the AC_OK sense signal 208 indicates an acceptable input AC power level and in response to determining that the LPS 118 is off (i.e., the LPS 118 is not already providing the monitored supply voltage).

According to at least one embodiment, the AC-OK circuit 116 further includes a switch or button (ON-SW) that, when pressed by a user, can force the processor 206 to turn on the LPS 118 regardless of the status of the AC_OK sense signal 208. For example, in such an embodiment, at block 404 the processor 206 is configured to turn on the LPS 118 in response to a determination that the switch or button (ON-SW) of the AC-OK circuit 116 has been pressed and in response to a determination that the LPS 118 is off (i.e., the LPS 118 is not providing the monitored supply voltage).

At block 406, the processor 206 waits for the LPS 118 to turn on. At block 408, in response to the LPS 118 turning on (i.e., the LPS 118 successfully outputting the monitored supply voltage (e.g., 3.3V)) or in response to the expiration of a predetermined period of time (e.g., 5 seconds), the processor 206 exits the low power mode and enters a normal mode of operation. In the normal mode of operation the processor 206 stops monitoring the AC-OK sense signal 208 of the differential amplifier 204 and communicates with the controller 114 of the UPS 100 to initialize different components of the UPS 100. For example, in the normal mode of operation, the processor 206 can communicate with the controller 114 to initialize the communication system of the UPS 100, the display system of the UPS 100, or any other system of the UPS 100. According to at least one embodiment, in the normal mode of operation, the controller 114 also accesses and reads from a memory system of the UPS 100 (e.g., an Electrically Erasable Programmable Read-Only Memory (EEPROM) or some other type of memory system).

In one embodiment, the processor 206 can enter the normal mode of operation (e.g., at block 408) directly from the low power state (e.g., at block 402) without monitoring the AC_OK sense signal 208, the status of the LPS 118, or the status of the switch or button (ON-SW) (e.g., at block 404). The processor 206 can enter the normal mode of operation (e.g., at block 408) directly from the low power state (e.g., at block 402) in response to determining that the LPS 118 is on (i.e., already providing the monitored supply voltage).

While in the normal mode of operation, for example at block 410, in response to the processor 206 identifying that the LPS 118 has turned off (i.e., not providing the monitored supply voltage (e.g., 3.3V)), the processor 206 communicates with the controller 114 of the UPS 100 to turn off the UPS 100 and the processor 206 transitions into the low power state, at block 402, as described above.

While in the normal mode of operation at block 410, in response to the processor 206 identifying that the UPS 100 has turned off, the processor 206 operates the LPS 118 to turn off at block 414. Once the LPS 118 has turned off, or after a predetermined period of time (e.g., 3 seconds), the processor 206 transitions into the low power state, as described above.

As described above, in the low power state, the processor 206 monitors the AC-OK sense signal 208 output by the differential amplifier 204 to determine the status of the input AC power received by the UPS 100. According to one embodiment, the processor 206 includes a buffer 207, for example, with 100 positions. The processor 206 samples the AC-OK sense signal 208 output by the differential amplifier 204. According to one embodiment, the processor 206 samples the AC-OK sense signal 208 once every 1 ms; however, in other embodiments, the processor 206 is configured to sample the AC-OK sense signal 208 at a different rate.

According to one embodiment, the processor 206 stores a value in each position of the buffer 207 that represents the squared value of the Root Mean Square (RMS) of the input voltage to the AC-OK circuit 116 over a 10 ms period. Accordingly, the average value of all 100 positions in the processor's 206 buffer 207 represents the squared value of the RMS of the input voltage to the AC-OK circuit 116 in the last 1 second. When the processor's 206 buffer 207 is full (i.e., 1 second after the processor begins sampling), the processor 206 starts comparing the sum of all values in the buffer 207 to predefined threshold limits. If the calculated sum is within a threshold limit window, the input voltage to the AC-OK circuit 116 is currently at an acceptable level. If the calculated sum is outside of the predefined threshold limit window, the input voltage to the AC-OK circuit 116 is currently not at an acceptable level. Upon determining that the input voltage to the AC-OK circuit 116 is currently at an acceptable level, the processor 206 transmits a signal (e.g., HF_ON_COM signal) to the LPS 118 to wake up the LPS 118, for example, as described above.

More specifically, according to at least one embodiment, the following equation is applied to each sample taken by the processor 206:

$Y_i=(A/D_{count}-2730)$, where $A/D_{count}$ has a value corresponding to the sampled value of the AC-OK signal 208. According to at least one embodiment, the AC-OK signal 208 is a sinusoidal signal superimposed on a 2 VDC signal. As such, when the input voltage provided to the AC-OK circuit 116 is 0V AC, the AC-OK signal 208 is 2 VDC and value of $A/D_{count}$ is 2730. The value 2730 is obtained as $(2^{12}-1)*(2/3)=2730$ and represents the value when the input voltage provided to the AC-OK circuit 116 is 0V and the processor 206 sees an AC-OK sense signal 208 of around 2 VDC generated from a 3V bias scaled with a resistor divider. As such, when the input voltage provided to the AC-OK circuit 116 is 0V, =(2730−2730)=0. In one embodiment, the resolution of the processor 206 is 12-bits and the range of $A/D_{count}$ is 0 to $4095(2^{12}-1)$; however, in other embodiments, the processor 206 can have a different resolution. As described above, the AC-OK circuit 116 receives a 3V bias voltage as a reference voltage; however, in other embodiments, the reference bias voltage can be defined at any other appropriate level.

Every 10 ms (i.e., 10 samples), the processor 206 calculates the next value to be stored in the buffer 207 as:

$$\text{Buffer}_i = (1/10) * \sum_{i=1}^{10} Y_i^2,$$

where $Y_i$, are the last 10 AC-OK signal 208 readings (in the last 10 ms). The processor 206 continues to fill the positions of the buffer 207 every 10 ms and after 1 second, the buffer 207 is full and the processor 206 can start comparing the summed total of the buffer 207 values to the predefined threshold limits. For example, in one embodiment, the processor 206 considers the input voltage to the AC-OK circuit 116 to be at an acceptable level if:

$$\text{AC\_OK\_Low\_Limit} < (1/100) * \sum_{i=1}^{100} \text{Buffer}_i < \text{AC\_OK\_High\_Limit}$$

where AC_OK_Low_Limit=205209 (corresponding to 82 Vrms) and AC_OK_Low_Limit=636804 (corresponding to 144.5 Vrms) (calculated based on resistor levels in the AC-OK circuit 116). In other embodiments, the threshold limit window can be defined differently to correspond to other desired voltage levels. The processor 206 checks the above condition every time it fills a new buffer 207 position (i.e., every 10 ms). In one embodiment, the condition must be continuously true for 1 second (i.e., for 100 comparisons) before the processor 206 declares that the input voltage to the AC-OK circuit 116 is acceptable and wakes up the LPS 118; however, in other embodiments, the processor 206 can be configured differently to monitor the AC_OK sense signal 208.

According to one embodiment, to determine the input voltage provided to the AC-OK circuit 116 based on the AC_OK sense signal 208 as described above, the AC_OK sense signal 208 is sampled 1000 times per second. As $A/D_{count}$ is a 12-bit number, its' square is a 24-bit number.

Accordingly, 4-bytes (32 bits) of Random-Access Memory (RAM) is utilized to store each value of the square of $A/D_{count}$. For 1000 samples, 4*1000 bytes (~4 KB) of RAM would be used to store all of the necessary $A/D_{count}$ samples. This can be a relatively large amount of RAM for a constrained embedded device.

As such, according to one embodiment, the following algorithm can be used to reduce the amount of RAM usage in monitoring the input voltage provided to the AC-OK circuit 116:

1. Define an $AD_{inner}$ variable to hold the average of 10 $A/D_{count}$ samples; Define a buffer $ADBuffer_{outer}$ with 100 elements (4*100 bytes) to store 100 values of $AD_{inner}$. The $ADBuffer_{outer}$ is used as a circular buffer.
2. Use a timer to generate an interrupt for every 1 millisecond.
3. The interrupt handler of the timer receives the $A/D_{count}$ values.
4. Add up the last ten samples of $A/D_{count}$ and store it to the variable $AD_{inner}$
5. Every 10 milliseconds, calculate the average of 10 samples ($AD_{inner}=AD_{inner}/10$), then populate it to $ADBuffer_{outer}$.
6. When the $ADBuffer_{outer}$ is filled up (e.g., after 1 second of system startup), calculate the mean square of the 100 values stored in $ADBuffer_{outer}$, compare it to the predetermined threshold values (e.g., as described above) to identify if AC input voltage is acceptable to turn on LPS system 118.
7. If AC input voltage is not acceptable, wait another 10 ms, repeat step 6. This feature is like a "moving window" to update system status.

By utilizing the algorithm described above, the RAM utilized by the AC-OK circuit 116 can be reduced from 4000 bytes to 400 bytes. Further, when the AC-OK circuit 116 initially turns on, it can determine the acceptability of the AC input voltage to turn on the LPS system 118 (e.g., 1 second after startup). If the AC input voltage is not acceptable, the system could make the decision regarding the acceptability of the AC input voltage every 10 milliseconds. In other embodiments, the timing of the AC-OK circuit 116 can be configured differently.

An algorithm for operating the processor 206 to analyze the AC_OK sense signal 208 is described above; however, in other embodiments, another appropriate algorithm may be utilized to determine if the AC_OK sense signal 208 indicates an input voltage at an acceptable level.

Figure 5:
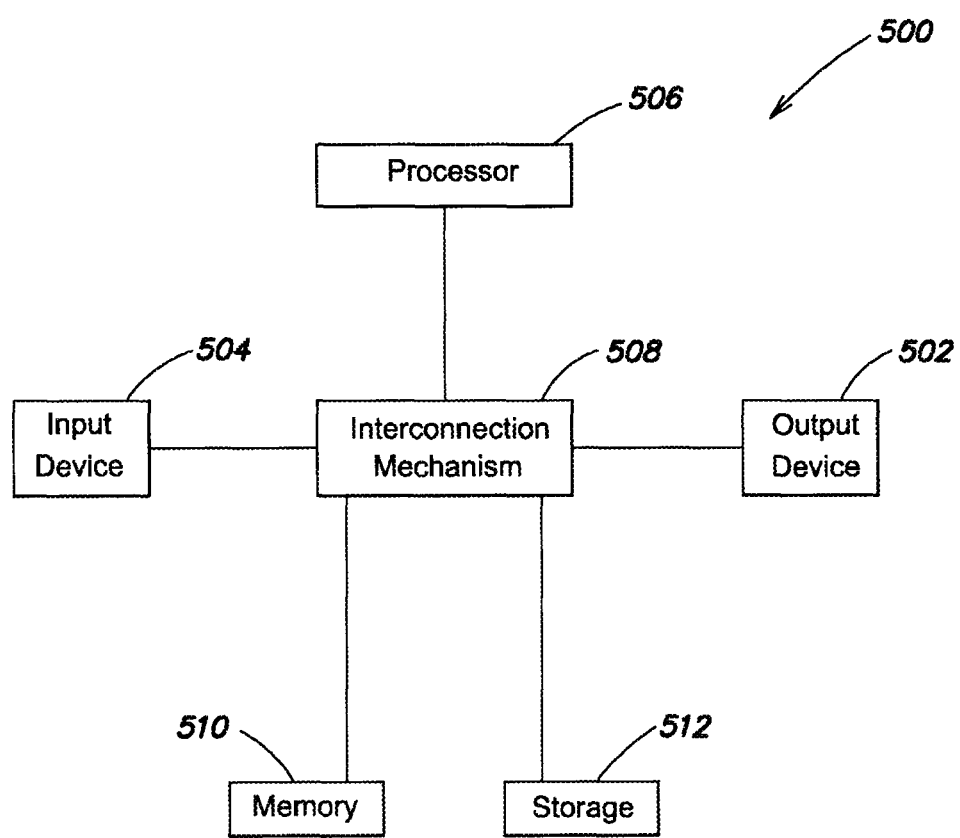
FIG. 5 is a block diagram of a system upon which various embodiments of the invention may be implemented.

FIG. 5 illustrates an example block diagram of computing components forming a system 500 which may be configured to implement one or more aspects disclosed herein. For example, the system 500 may be communicatively coupled to the controller 114 or processor 206, or included within the controller 114 or processor 206. The system 500 may also be configured to operate a UPS or AC-OK circuit, as described above.

The system 500 may include for example a computing platform such as those based on Intel PENTIUM-type processor, Motorola PowerPC, Sun UltraSPARC, Texas Instruments-DSP, Hewlett-Packard PA-RISC processors, or any other type of processor. System 500 may include specially-programmed, special-purpose hardware, for example, an application-specific integrated circuit (ASIC). System 500 may also include a Field Programmable Gate Array (FPGA). Various aspects of the present disclosure may be implemented as specialized software executing on the system 500 such as that shown in FIG. 5.

The system 500 may include a processor/ASIC 506 connected to one or more memory devices 510, such as a disk drive, memory, flash memory or other device for storing data. Memory 510 may be used for storing programs and data during operation of the system 500. Components of the computer system 500 may be coupled by an interconnection mechanism 508, which may include one or more buses (e.g., between components that are integrated within a same machine) and/or a network (e.g., between components that reside on separate machines). The interconnection mechanism 508 enables communications (e.g., data, instructions) to be exchanged between components of the system 500. The system 500 also includes one or more input devices 504, which may include for example, a keyboard or a touch screen. The system 500 includes one or more output devices 502, which may include for example a display. In addition, the computer system 500 may contain one or more interfaces (not shown) that may connect the computer system 500 to a communication network, in addition or as an alternative to the interconnection mechanism 508.

The system 500 may include a storage system 512, which may include a computer readable and/or writeable nonvolatile medium in which signals may be stored to provide a program to be executed by the processor or to provide information stored on or in the medium to be processed by the program. The medium may, for example, be a disk or flash memory and in some examples may include RAM or other non-volatile memory such as EEPROM. In some embodiments, the processor may cause data to be read from the nonvolatile medium into another memory 510 that allows for faster access to the information by the processor/ASIC than does the medium. This memory 510 may be a volatile, random access memory such as a dynamic random access memory (DRAM) or static memory (SRAM). It may be located in storage system 512 or in memory system 510. The processor 506 may manipulate the data within the integrated circuit memory 510 and then copy the data to the storage 512 after processing is completed. A variety of mechanisms are known for managing data movement between storage 512 and the integrated circuit memory element 510, and the disclosure is not limited thereto. The disclosure is not limited to a particular memory system 510 or a storage system 512.

The system 500 may include a computer platform that is programmable using a high-level computer programming language. The system 500 may be also implemented using specially programmed, special purpose hardware, e.g. an ASIC. The system 500 may include a processor 506, which may be a commercially available processor such as the well-known Pentium class processor available from the Intel Corporation. Many other processors are available. The processor 506 may execute an operating system which may be, for example, a Windows operating system available from the Microsoft Corporation, MAC OS System X available from Apple Computer, the Solaris Operating System available from Sun Microsystems, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

According to one embodiment, the AC-OK circuit 116 further includes a switch configured to be coupled to the AC mains power source 101 and to processor 206. In such an embodiment, the processor 206 can operate the switch to disconnect the AC-OK circuit 116 from the AC mains power source 101 at any desired time.

According to at least one embodiment, DC power from the auxiliary charger is also provided to the battery 112 to charge the battery 112.

As described above, an AC-OK is provided that is less complex, includes fewer components, and results in less power consumption/dissipation than traditional AC-OK circuits. By operating the processor of the AC-OK circuit in a low-power mode when AC-OK sense signal analysis is not being performed, the power consumption of the AC-OK circuit is relatively low when not being used. In addition, by analyzing the AC-OK sense signal generated by a differential amplifier without rectification, and analyzing the AC-OK sense signal over time, as described above, the precision of the AC-OK circuit can be improved while reducing the power dissipation/consumption of the AC-OK circuit.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A power circuit comprising:
an input configured to be coupled to an AC source and to receive input AC power from the AC source, the input AC power having an input AC voltage level;
an auxiliary charger coupled to the input, the auxiliary charger configured to convert the input AC power from the input into DC power;
a differential amplifier coupled to the auxiliary charger and the input, the differential amplifier configured to be powered by the DC power from the auxiliary charger, to monitor the input AC voltage level, and to generate a sense signal based on a status of the input AC voltage level; and
a processor coupled to the auxiliary charger and the differential amplifier, the processor configured to be coupled to a Logic Power Supply (LPS), to be powered into a low power mode of operation by the DC power from the auxiliary charger, to analyze the sense signal from the differential amplifier in the low power mode of operation, and to turn on the LPS in response to a determination that the input AC voltage level is acceptable.

2. The power circuit of claim 1, wherein the auxiliary charger includes an offline DC-DC converter.

3. The power circuit of claim 1, wherein the differential amplifier comprises an operational amplifier coupled to the input and a reference voltage, the differential amplifier configured to generate the sense signal based on a difference between the input AC voltage level and the reference voltage.

4. The power circuit of claim 3, wherein the operational amplifier includes a supply input coupled to the auxiliary charger and configured to receive the DC power.

5. The power circuit of claim 3, wherein in analyzing the sense signal, the processor is further configured to determine whether the input AC voltage level is acceptable by determining whether the sense signal indicates that the input AC voltage level is within an input voltage threshold range.

6. The power circuit of claim 5, wherein in response to determining that the sense signal indicates that the input AC voltage level is within the input voltage threshold range, the processor is further configured to transmit a signal to the LPS to turn on the LPS.

7. The power circuit of claim 6, wherein in response to the LPS turning on, the processor is further configured to enter a normal mode of operation, and to communicate, in the normal mode of operation, with an Uninterruptible Power Supply (UPS) coupled to the LPS to initialize at least one system of the UPS.

8. The power circuit of claim 6, wherein the processor is further configured to maintain a buffer, and wherein in determining whether the sense signal indicates that the input AC voltage level is within the input voltage threshold range, the processor is further configured to:
periodically sample the sense signal;
calculate, based on the periodically sampled sense signal, a plurality of values, each value corresponding to the input AC voltage level over a period of time; and
store each one of the plurality of values in a position of the buffer.

9. The power circuit of claim 8, wherein in determining whether the sense signal indicates that the input AC voltage level is within the input voltage threshold range, the processor is further configured to:
determine whether each position in the buffer is full;
in response to determining that each position in the buffer is full, sum each one of the plurality of values stored in the buffer to generate a total summed value;
compare the total summed value to a summed threshold limit window; and
determine, based on comparing the total summed value to the summed threshold limit window, whether the input AC voltage level is within the input voltage threshold range.

10. The power circuit of claim 9, wherein in determining whether the input AC voltage level is within the input voltage threshold range, the processor is further configured to determine that the input AC voltage level is within the input voltage threshold range in response to determining that the total summed value is within the summed threshold limit window.

11. A method for operating an LPS of an Uninterruptible Power Supply, the method comprising acts of:
receiving input AC power from an AC source, the input AC power having an input AC voltage level;
converting the input AC power into DC power;
powering a differential amplifier with the DC power;
powering a processor into a low power mode of operation with the DC power;
monitoring, with the differential amplifier, the input AC power;
generating, based on the act of monitoring, a sense signal;
analyzing, with the processor in the low power mode of operation, the sense signal; and
controlling an operational state of the LPS based on the act of analyzing the sense signal, including turning on the LPS in response to a determination that the input AC voltage level is acceptable.

12. The method of claim 11, wherein generating the sense signal comprises generating the sense signal based on a difference between the input AC voltage level and a reference voltage.

13. The method of claim 12, wherein the differential amplifier includes an operational amplifier and wherein powering the differential amplifier with the DC power comprises providing the DC power to a supply input of the operational amplifier.

14. The method of claim 11, wherein analyzing the sense signal comprises determining whether the input AC voltage level is acceptable by determining whether the sense signal indicates that the input AC voltage level is within an input voltage threshold range.

15. The method of claim 14, wherein turning on the LPS in response to a determination that the input AC voltage level is acceptable comprises transmitting a signal to the LPS to turn on the LPS in response to determining that the sense signal indicates that the input AC voltage level is within the input voltage threshold range.

16. The method of claim 15, further comprising:
turning on the LPS;
in response to turning on the LPS, powering up the processor into a normal mode of operation; and
initializing, with the processor in the normal mode of operation, at least one system of the UPS.

17. The method of claim 14, wherein determining whether the sense signal indicates that the input AC voltage level is within the input voltage threshold range comprises:
periodically sampling the sense signal;
calculating, based on the periodically sampled sense signal, a plurality of values, each value corresponding to the input AC voltage level over a period of time; and
storing each one of the plurality of values in a position of a buffer maintained by the processor.

18. The method of claim 17, wherein determining whether the sense signal indicates that the input AC voltage level is within the input voltage threshold range further comprises:
determining whether each position in the buffer is full;
in response to determining that each position in the buffer is full, summing each one of the plurality of values stored in the buffer to generate a total summed value;
comparing the total summed value to a summed threshold limit window; and
determining, based on comparing the total summed value to the summed threshold limit window, whether the input AC voltage level is within the input voltage threshold range.

19. The method of claim 18, wherein determining whether the input AC voltage level is within the input voltage threshold range comprises determining that the input AC voltage level is within the input voltage threshold range in response to determining that the total summed value is within the summed threshold limit window.

* * * * *